United States Patent
An et al.

(10) Patent No.: US 11,357,100 B2
(45) Date of Patent: Jun. 7, 2022

(54) DATA TRANSMISSION CIRCUIT BOARD, MOBILE INDUSTRY PROCESSOR INTERFACE AND DEVICE

(71) Applicants: Beijing BOE Optoelectronics Technology Co., Ltd., Beijing (CN); BOE Technology Group Co., Ltd., Beijing (CN)

(72) Inventors: Na An, Beijing (CN); Quan Long, Beijing (CN); Guochun Wang, Beijing (CN); Zuoxin Yu, Beijing (CN); Dianzhong Liu, Beijing (CN); Xinfeng Gong, Beijing (CN); Gang Ci, Beijing (CN); Baolei Guo, Beijing (CN); Bin Xu, Beijing (CN); Shaopeng Xu, Beijing (CN); Xuzhong Liu, Beijing (CN); Zongwei Luo, Beijing (CN); Jinzhao Zhou, Beijing (CN); Xiao Ma, Beijing (CN); Zhenhua Luo, Beijing (CN); Qingzhu Guan, Beijing (CN); Zheng Zhang, Beijing (CN); Wei Su, Beijing (CN)

(73) Assignees: Beijing BOE Optoelectronics Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 552 days.

(21) Appl. No.: 16/472,286

(22) PCT Filed: Dec. 13, 2018

(86) PCT No.: PCT/CN2018/120958
§ 371 (c)(1),
(2) Date: Jun. 21, 2019

(87) PCT Pub. No.: WO2019/169923
PCT Pub. Date: Sep. 12, 2019

(65) Prior Publication Data
US 2021/0410275 A1    Dec. 30, 2021

(30) Foreign Application Priority Data
Mar. 9, 2018 (CN) .......................... 201810194072.2

(51) Int. Cl.
*H05K 1/00* (2006.01)
*H05K 1/02* (2006.01)

(52) U.S. Cl.
CPC ......... *H05K 1/0259* (2013.01); *H05K 1/0262* (2013.01)

(58) Field of Classification Search
CPC ........................... H05K 1/0259; H05K 1/0262
See application file for complete search history.

(56) References Cited

U.S. PATENT DOCUMENTS 5,686,872 A * 11/1997 Fried .................. H04L 25/0278
333/22 R
2011/0188146 A1 * 8/2011 Oh ........................... H02H 9/04
(Continued)

FOREIGN PATENT DOCUMENTS

CN          2922290 Y      7/2007
CN       201230205 Y      4/2009
(Continued)

OTHER PUBLICATIONS

Chinese Office Action dated Jun. 28, 2019 in related Chinese Application No. 201810194072.2.
(Continued)

*Primary Examiner* — Pete T Lee
(74) *Attorney, Agent, or Firm* — ArentFox Schiff LLP; Michael Fainberg

(57) ABSTRACT

A data transmission circuit board, a mobile industry processor interface and a device are provided. The data transmission circuit board includes: a wiring substrate; a plurality of data transmission line pairs on one side of the wiring substrate; and a plurality of transient voltage suppression diodes on the one side of the wiring substrate. Data transmission lines of the data transmission line pairs are coupled to the transient voltage suppression diodes in a one-to-one correspondence, the line width of at least one data transmission line is within a line width threshold range; and the transient voltage suppression diode is configured to discharge when a voltage to ground on the corresponding data transmission line is greater than a discharge voltage threshold, wherein the discharge voltage threshold is not less than (Continued)

a maximum voltage value of the differential signal transmitted on the data transmission line.

16 Claims, 4 Drawing Sheets

(56) References Cited

U.S. PATENT DOCUMENTS

| | | | |
|---|---|---|---|
| 2013/0003242 A1* | 1/2013 | Lin | H02H 9/046 361/111 |
| 2013/0082915 A1 | 4/2013 | Nakagawa | |
| 2015/0029634 A1 | 1/2015 | Yang | |
| 2018/0292720 A1 | 10/2018 | Lu et al. | |

FOREIGN PATENT DOCUMENTS

| | | |
|---|---|---|
| CN | 201323446 Y | 10/2009 |
| CN | 102684181 A | 9/2012 |
| CN | 103034009 A | 4/2013 |
| CN | 203434949 U | 2/2014 |
| CN | 103905654 A | 7/2014 |
| CN | 104867437 A | 8/2015 |
| CN | 104900206 A | 9/2015 |
| CN | 105118412 A | 12/2015 |
| CN | 105959063 A | 9/2016 |
| CN | 106099892 A | 11/2016 |
| CN | 108430153 A | 8/2018 |

OTHER PUBLICATIONS

International Search Report dated Feb. 11, 2019 for related International Application No. PCT/CN2018/120958.

* cited by examiner

DATA TRANSMISSION CIRCUIT BOARD, MOBILE INDUSTRY PROCESSOR INTERFACE AND DEVICE

This application is a US National Stage of International Application No. PCT/CN2018/120958, filed Dec. 13, 2018, which claims priority to Chinese Patent Application No. 201810194072.2, filed with the Chinese Patent Office on Mar. 9, 2018 and entitled "Data Transmission Circuit Board, Display Module and Electronic Device", which is incorporated herein by reference in its entirety.

FIELD

The present disclosure relates to the field of data transmission, and in particular to a data transmission circuit board, a mobile industry processor interface, a display module, and an electronic device.

BACKGROUND

Currently, the mobile industry processor interface (MIPI) is widely used in the process of transmitting data from the mobile communications device mainboard to the driver IC of the mobile communication display panel. Compared with the traditional parallel interface transmission, the MIPI line has advantages of fast transmission speed, large data transmission quantity, low power consumption and good anti-interference, and are increasingly favored by customers. However, when an Eletro-static discharge (ESD) test is performed on an electronic device, a signal transmitted at a high speed in an MIPI line may be disturbed by a static electricity, thereby causing a flash screen of the electronic device; or when an electronic device is suffering from a large current impact, the control signal line may be burned, causing the MIPI line to be burned.

SUMMARY

This embodiment of the present disclosure provides a data transmission circuit board, applied to a mobile industry processor interface. The data transmission circuit board includes: a wiring substrate; a plurality of data transmission line pairs on a side of the wiring substrate; and a plurality of transient voltage suppression diodes on the side of the wiring substrate; wherein data transmission lines of the data transmission line pairs are coupled to transient voltage suppression diodes in a one-to-one correspondence, and the line width of each data transmission line is within a line width threshold range; the transient voltage suppression diode is configured to discharge when a voltage to ground on a corresponding data transmission line is greater than a discharge voltage threshold; wherein the discharge voltage threshold is not less than a maximum voltage value of a differential signal transmitted on the data transmission line.

Optionally, in this embodiment of the present disclosure, for one data transmission line pair, the transient voltage suppression diodes coupled to the data transmission lines are symmetrically disposed on two sides of an extension direction of the data transmission line pair.

Optionally, in this embodiment of the present disclosure, the transient voltage suppression diode is at an input end, adjacent to the mobile industry processor interface, of the corresponding data transmission line.

Optionally, in this embodiment of the present disclosure, a first terminal of the transient voltage suppression diode is connected to the corresponding data transmission line, and a second terminal of the transient voltage suppression diode is grounded.

Optionally, in this embodiment of the present disclosure, the transient voltage suppression diode is a unidirectional transient voltage suppression diode, a positive terminal of the unidirectional transient voltage suppression diode is connected to the data transmission line, and a negative terminal of the unidirectional transient voltage suppression diode is grounded.

Optionally, in this embodiment of the present disclosure, the transient voltage suppression diode is a bi-directional transient voltage suppression diode, a positive terminal of the bi-directional transient voltage suppression diode is connected to the data transmission line, and a negative terminal of the bi-directional transient voltage suppression diode is grounded.

Optionally, in this embodiment of the present disclosure, the transient voltage suppression diode is a bi-directional transient voltage suppression diode, a positive terminal of the bi-directional transient voltage suppression diode is grounded, and a negative terminal of the bi-directional transient voltage suppression diode is connected to the data transmission line.

Optionally, in this embodiment of the present disclosure, at least one data transmission line of each data transmission line pair is coupled to a differential impedance adjustment module; and the differential impedance adjustment module is configured to adjust a differential impedance of the coupled data transmission line.

Optionally, in this embodiment of the present disclosure, the differential impedance adjustment module comprises an adjustment resistor, and the adjustment resistor is in series connected with the data transmission line.

Optionally, in this embodiment of the present disclosure, a parasitic capacitance of the transient voltage suppression diode is less than 0.5 pf.

Optionally, in this embodiment of the present disclosure, the line width threshold ranges from 20 μm to 50 μm.

Optionally, in this embodiment of the present disclosure, the data transmission circuit board is a flexible printed circuit.

Accordingly, this embodiment of the present disclosure also provides a mobile industry processor interface, including the data transmission circuit board provided by this embodiment of the present disclosure.

Accordingly, this embodiment of the present disclosure also provides a display module, including the mobile industry processor interface provided by this embodiment of the present disclosure.

Accordingly, this embodiment of the present disclosure also provides an electronic device, including the mobile industry processor interface provided by this embodiment of the present disclosure.

Optionally, in this embodiment of the present disclosure, the electronic device includes a mobile terminal.

DETAILED DESCRIPTION

Figure 1:
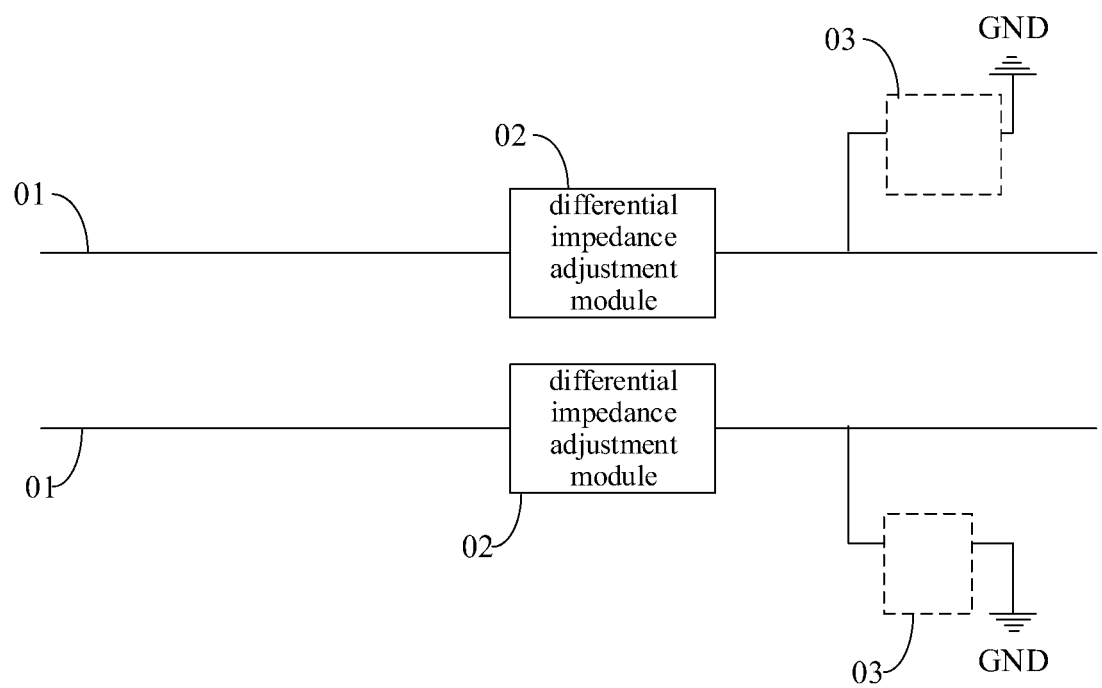
FIG. 1 is a schematic structural diagram of a data transmission line pair in a data transmission circuit board in accordance with an embodiment of the present disclosure.

In order to make the objects, technical solutions, and advantages of the present disclosure more clear, the specific embodiments of the present disclosure are described below with reference to the accompanying drawings. It should be understood that the described embodiments are merely used for illustrating and explaining the present disclosure, but are not used for limiting the present disclosure. And in case of no conflict, the embodiments in the present disclosure and the features in the embodiments may be combined with each other. It should be noted that the shapes of the various figures in the drawings do not indicate the true scale, and are merely intended to illustrate the contents of the present disclosure.

It should be noted that the same or similar reference numbers indicate the same or similar elements having the same or similar functions. The embodiments described below with reference to the accompanying drawings are exemplary, are merely intended to illustrate the present disclosure, and are not to limit the present disclosure.

Figure 3:
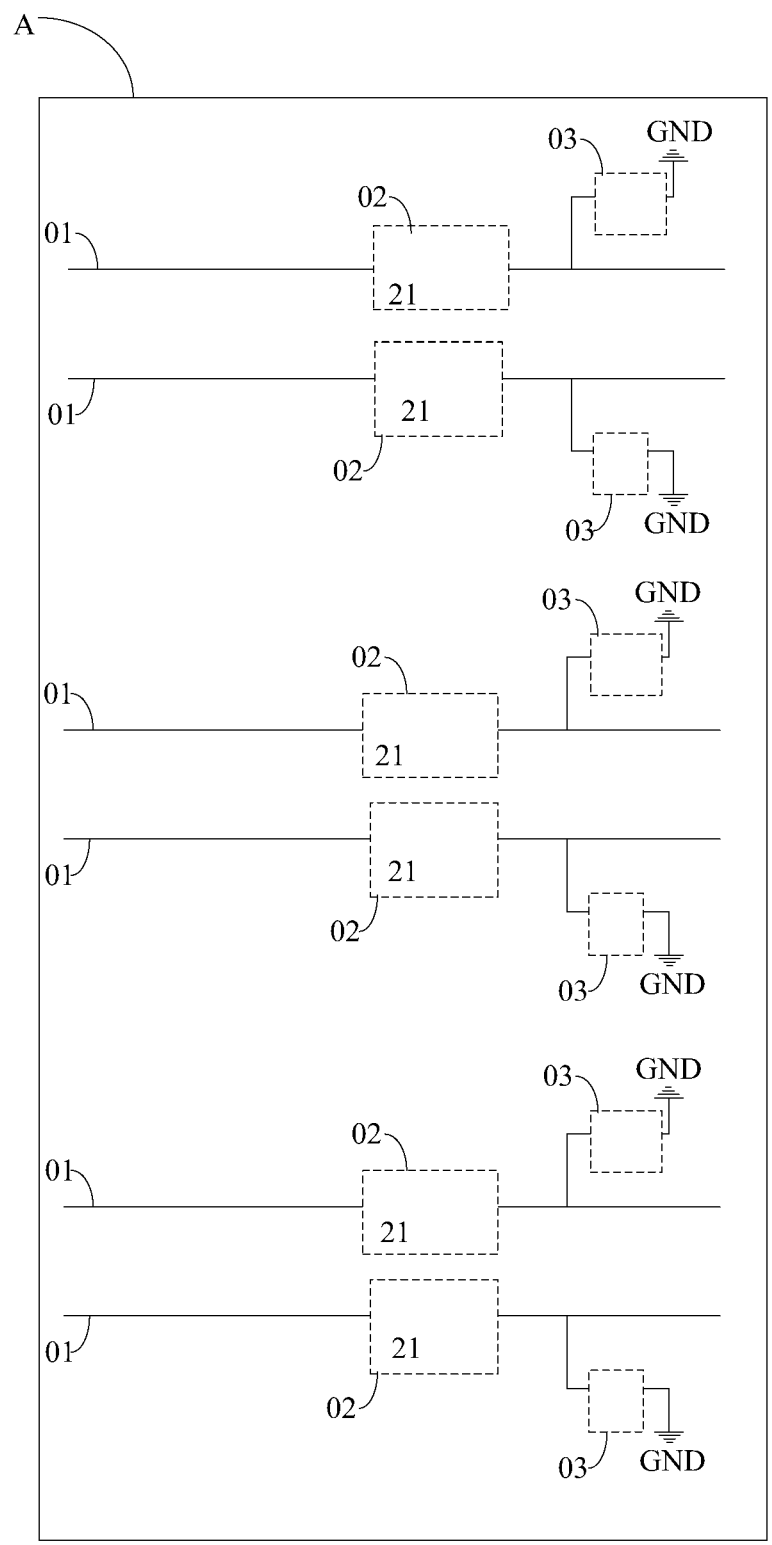
FIG. 3 is a schematic structural diagram of a data transmission circuit board in accordance with an embodiment of the present disclosure.

As shown in FIG. 1 and FIG. 3, a data transmission circuit board in accordance with this embodiment of the present disclosure is applied to a mobile industry processor interface (MIPI). The data transmission circuit board A can include a wiring substrate, a plurality of data transmission line pairs and a plurality of transient voltage suppression diodes 03 located on one side of the wiring substrate. The data transmission lines 01 are configured for transmitting differential signals, data transmission lines 01 in data transmission line pairs are coupled to transient voltage suppression diodes 03 in a one-to-one correspondence, and the line width of each data transmission line 01 is within a line width threshold range. Each transient voltage suppression diode 03 is configured to discharge when a voltage to ground on the corresponding data transmission line 01 is greater than a discharge voltage threshold, wherein the discharge voltage threshold is not less than a maximum voltage value of the differential signal transmitted by the data transmission line.

The data transmission circuit board provided by this embodiment of the present disclosure is applied to a mobile industry processor interface. The data transmission circuit board includes a wiring substrate, a plurality of data transmission line pairs and a plurality of transient voltage suppression diodes located on one side of the wiring substrate. Data transmission lines in data transmission line pairs are coupled to transient voltage suppression diodes in a one-to-one correspondence, and the line width of each data transmission line is within a line width threshold range. Each transient voltage suppression diode is configured to discharge when a voltage to ground on the corresponding data transmission line is greater than a discharge voltage threshold, wherein the discharge voltage threshold is not less than a maximum voltage value of the differential signal transmitted by the data transmission line. Therefore, the data transmission line can be coupled to the transient voltage suppression diode to release the static electricity or large current through the transient voltage suppression diode when the data transmission line is subjected to static electricity interference or large current interference. In addition, by adjusting the line width of each data signal line, the differential impedance of the data transmission line can be kept within the range specified by the MIPI protocol, so as to avoid the influence of static electricity or large current on the differential signal transmitted on the data transmission line at high speed.

It should be noted that the data transmission circuit board provided by this embodiment of the present disclosure is mainly applied to a mobile industry processor interface, namely, MIPI line. Since the differential signal transmitted by the MIPI line is a high-speed differential signal, the rate of each data transmission line can reach 1.2 Gbps. In order to ensure that the differential signal transmitted by the MIPI line is at high speed and the transmitted data is not disturbed, the MIPI protocol specifies that the differential impedance of each line ranges from 90 to 110 ohms. Therefore, in order to ensure that the differential impedance of each data transmission line pair meets the above requirements, the data transmission lines cannot be connected to an electrostatic discharge circuit, that is, when the data transmission lines are connected to the electrostatic discharge circuit, the parasitic capacitance of the electrostatic discharge circuit is relatively large, resulting in reduction of the impedance of the data transmission lines, thereby causing that the differential impedance of each data transmission line pair cannot meet the requirements of the MIPI protocol.

Therefore, in the data transmission circuit board provided by this embodiment of the present disclosure, the data transmission circuit board includes a plurality of data transmission line pairs. Each data transmission line pair includes a pair of data transmission lines, namely, two data transmission lines, wherein the data transmission line pairs can be configured for transmitting different differential signals. Specifically, the data transmission line is coupled to the transient voltage suppression diode, the impedance of the transient voltage suppression diode drops suddenly at a great high speed (up to $1*10^{-12}$ seconds) when two ends of the transient voltage suppression diode are subjected to an instant high energy impact such as electrostatic interference or large current shock, and the transient voltage suppression diode absorbs a large current to clamp a voltage between two ends of the transient voltage suppression diode at a predetermined value, thus ensuring that the following circuit elements are prevented from being damaged by instant high energy impact. In addition, since the transient voltage suppression diode also has a certain parasitic capacitance, the impedance on the corresponding data transmission line is reduced. Therefore, it is necessary to adjust the line width of the data transmission line to keep the differential impedance on each data transmission line pair within the range specified by the MIPI protocol, thereby ensuring the normal transmission of differential signals. In a specific implementation, in the data transmission line board above provided by the embodiment of the present disclosure, the line width threshold range of the line width of the data transmission line may be set between 20 μm and 50 μm. It should be noted that, in the data transmission line board provided by the above embodiment of the present disclosure, the line width of the data transmission line has an influence on the differential impedance of the data transmission line pair. Therefore, the differential impedance of the data transmission line pair can be compensated by appropriately reducing the line width of the data transmission line. It is measured by an open experiment that when the line width range is 20 μm-50 μm, the differential impedance can be compensated, and the data transmission line can be prevented from being broken due to being too thin. The specific line width of the data transmission line is selected based on a combination of differential impedance, line width, and line spacing.

It should be noted that, each data transmission line in the MIPI line is a differential line for differential signal transmission. The differential line pair should be tightly coupled internally, the shape of the line should be symmetrical, and the length of the differential lines should be the same length to avoid error codes caused by transmission delay. Therefore, the number and physical parameters of the transient voltage suppression diodes connected to data transmission lines in one data transmission line pair should be consistent as much as possible to ensure better transmission of the differential signal.

In the data transmission line board provided by the foregoing embodiment of the present disclosure, the transient voltage suppression diode discharges when the voltage on the corresponding data transmission line is greater than the discharge voltage threshold, and the discharge voltage threshold is set according to the differential signal transmitted on the data transmission line. Since the differential signal transmitted on the data transmission line is not a differential signal having a single voltage value, the discharge voltage threshold is set to be not less than the maximum voltage value of the differential signal transmitted on the data transmission line, which can avoid setting the discharge voltage threshold too small to cause the transient voltage suppression diode to erroneously discharge the differential signal. Certainly, the discharge voltage threshold should not be set too large. If the setting is too large, there will still be large static electricity or large current interference on each data transmission line, and the static electricity will not be released. To sum up, the discharge voltage threshold is reasonably set based on the differential signal transmitted by the data transmission line during the actual use.

In a specific implementation, in the data transmission line board provided by the foregoing embodiment of the present disclosure, as shown in FIG. 1, for one data transmission line pair, the transient voltage suppression diodes 03 coupled to the data transmission lines 01 are symmetrically disposed on two sides of the extension direction of the data transmission line pair. In this way, the data transmission lines 01 are disposed between the two transient voltage suppression diodes 03, so that the two data transmission lines in the data transmission line pair are close to each other, thereby enhancing the coupling between the two data transmission lines.

In a specific implementation, in the data transmission line board provided in the embodiment of the present disclosure, the transient voltage suppression diode may be located at an input end, adjacent to the mobile industry processor interface, of the corresponding data transmission line, and such a setting can better release the fluctuation voltage caused by interference from the mainboard.

In a specific implementation, in the data transmission line board provided by the embodiment of the present disclosure, as shown in FIG. 1, a first terminal of the transient voltage suppression diode 03 is connected to the corresponding data transmission line 01, and a second terminal of the transient voltage suppression diode 03 is grounded. In a specific implementation, a parasitic capacitance of the transient voltage suppression diode can be set to be less than 0.5 pf. In this way, the influence of the transient voltage suppression diode on the differential impedance of the data line pair can be minimized by selecting a transient voltage suppression diode with a parasitic capacitance less than 0.5 pf.

Specifically, in the data transmission line board provided by this embodiment of the present disclosure, the transient voltage suppression diode may be a unidirectional transient voltage suppression diode, a positive terminal of the unidirectional transient voltage suppression diode is connected to the data transmission line, and a negative terminal of the unidirectional transient voltage suppression diode is grounded.

Specifically, in the data transmission line board provided by this embodiment of the present disclosure, the transient voltage suppression diode may also be a bi-directional transient voltage suppression diode. A positive terminal of the bi-directional transient voltage suppression diode is connected to the data transmission line, and a negative terminal of the bi-directional transient voltage suppression diode is grounded. Alternatively, the positive terminal of the bi-directional transient voltage suppression diode is grounded, and the negative terminal of the bi-directional transient voltage suppression diode is connected to the data transmission line.

Further, in the data transmission line board provided by this embodiment of the present disclosure, as shown in FIG. 1, at least one data transmission line 01 of each data transmission line pair is coupled to a differential impedance adjustment module 02.

The differential impedance adjustment module 02 is configured to adjust a differential impedance of the coupled data transmission line 01 so that the differential impedance of the data transmission line pair including the coupled data transmission line 01 can be within the range specified by the MIPI protocol. Further, in the data transmission line board provided by this embodiment of the present disclosure, each data transmission line is connected to a differential impedance adjustment module. In the specific implementation, on the basis that the line width of each data transmission line is within the threshold range, the data transmission lines each can be connected in series with a differential impedance adjustment module to better ensure that the differential impedance of the two data transmission lines in each data transmission line pair can be within the range specified by the MIPI protocol.

Figure 2:
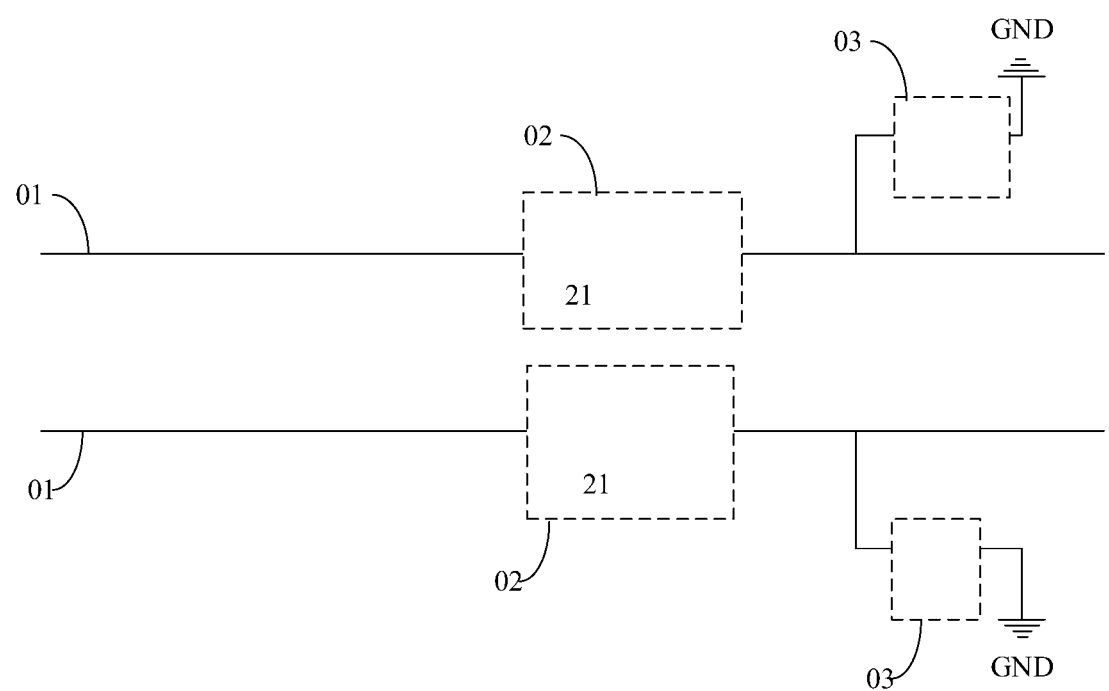
FIG. 2 is another schematic structural diagram of a data transmission line pair in a data transmission circuit board in accordance with an embodiment of the present disclosure.

In the specific implementation, in the data transmission line board provided by this embodiment of the present disclosure, as shown in FIG. 2, the differential impedance adjustment module 02 may include an adjustment resistor 21, and the adjustment resistor 21 is in series connected with the corresponding data transmission line 01. The adjustment resistor may be a variable resistor or a resistor with fixed resistance, and the fixed resistance can be determined by adjusting the variable resistor.

It should be noted that, the descriptions of the differential impedance adjustment module including the adjustment resistor in the foregoing embodiments are only some specific embodiments, certainly any other devices capable of adjusting the impedance of the data transmission line are within the scope of the present disclosure, and are selected according to requirements in a specific implementation, although the embodiment of this disclosure will not be limited thereto.

In a specific implementation, in the data transmission line board provided by this embodiment of the present disclosure, the data transmission circuit board may be a flexible printed circuit.

Based on the same inventive concept, this embodiment of the present disclosure further provides a mobile industry processor interface, including the foregoing data transmission circuit board provided by this embodiment of the present disclosure. For the specific structure of the data transmission circuit board, refer to the foregoing description, and details are not described herein again.

Figure 4:
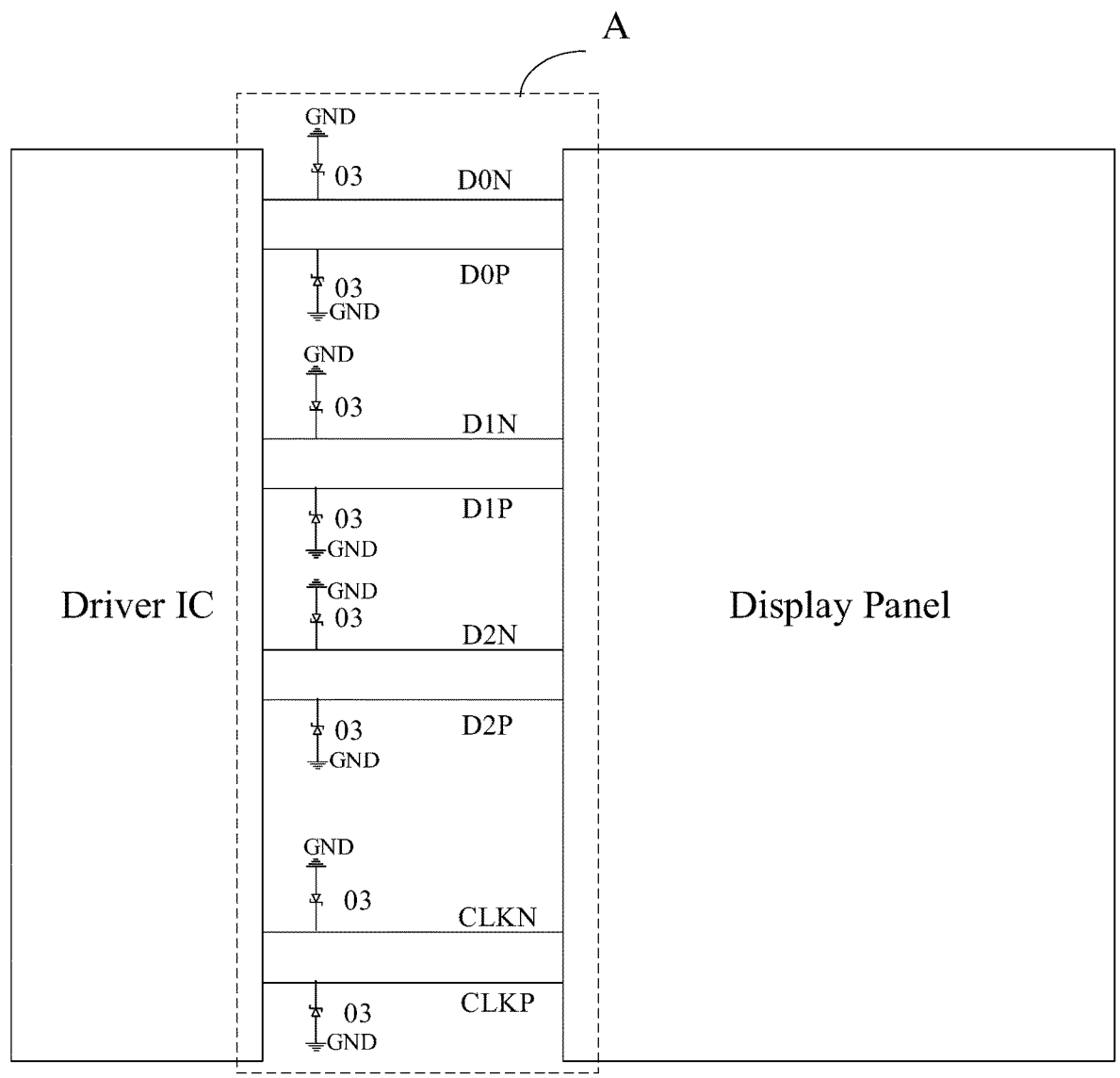
FIG. 4 is a schematic structural diagram of a display module in accordance with an embodiment of the present disclosure.

Based on the same inventive concept, this embodiment of the present disclosure further provides a display module, as shown in FIG. 4, including the mobile industry processor interface provided by this embodiment of the present disclosure, and the mobile industry processor interface includes a data transmission circuit board A.

In a specific implementation, as shown in FIG. 4, the driver IC can provide a data signal and a clock signal in the form of a differential signal to the display panel through the data transmission circuit board, wherein D0N and D0P are a data transmission line pair, D1N and D1P are a data transmission line pair, and D2N and D2P are a data transmission line pair, which are respectively used for transmitting data signals, and CLKN and CLKP are a data transmission line pair for transmitting clock signals. Certainly, other data transmission line pairs may be included to transmit other signals, although the embodiment of this disclosure will not be limited thereto.

Based on the same inventive concept, this embodiment of the present disclosure further provides an electronic device, including the mobile industry processor interface provided by the embodiment of the present disclosure, and the mobile industry processor interface includes a data transmission circuit board. The electronic device includes a mobile terminal, and specifically may be any product or component having a display function, such as a mobile phone, a tablet computer, a laptop, a navigator, or the like. For the implementation of the electronic device, refer to the embodiments of the data transmission circuit board, and the repeated description is not described herein again.

The present disclosure discloses a data transmission circuit board, a mobile industry processor interface, a display module, and an electronic device. The data transmission circuit board includes a wiring substrate, a plurality of data transmission line pairs and a plurality of transient voltage suppression diodes located on one side of the wiring substrate. Data transmission lines of data transmission line pairs are coupled to transient voltage suppression diodes in a one-to-one correspondence, and the line width of each data transmission line is within a line width threshold range. Each transient voltage suppression diode is configured to discharge when a voltage to ground on the corresponding data transmission line is greater than a discharge voltage threshold, wherein the discharge voltage threshold is not less than a maximum voltage value of the differential signal transmitted by the data transmission line. Therefore, the data transmission lines can be coupled to the transient voltage suppression diodes to release the static electricity or large current through the transient voltage suppression diodes when the data transmission lines are subjected to static electricity interference or large current interference. In addition, by adjusting the line width of each data signal line, the differential impedance of the data transmission line can be kept within the range specified by the MIPI protocol, so as to avoid the influence of static electricity or large current on the differential signal transmitted on the data transmission line at high speed.

Apparently, a person skilled in the art can make various modifications and variations to the present disclosure without departing from the spirit and scope of the present disclosure. In this way, if such modifications and variations of the present disclosure are within the scope of the claims and equivalent technologies of the present disclosure, it is intended that the present disclosure covers the modifications and variations.

The invention claimed is:

1. A data transmission circuit board, applied to a mobile industry processor interface, wherein the data transmission circuit board comprises:
   a wiring substrate;
   a plurality of data transmission line pairs on one side of the wiring substrate; and
   a plurality of transient voltage suppression diodes on the one side of the wiring substrate;
   wherein:
   data transmission lines of the data transmission line pairs are coupled to the transient voltage suppression diodes in a one-to-one correspondence, and a line width of at least one of the data transmission lines is within a line width threshold range;
   the transient voltage suppression diode is configured to discharge when a voltage to ground on a corresponding data transmission line is greater than a discharge voltage threshold; wherein the discharge voltage threshold is not less than a maximum voltage value of a differential signal transmitted on the data transmission line.

2. The data transmission circuit board according to claim 1, wherein for one data transmission line pair, the transient voltage suppression diodes coupled to the data transmission lines are symmetrically disposed on two sides of an extension direction of the data transmission line pair.

3. The data transmission circuit board according to claim 1, wherein the transient voltage suppression diode is at an input end, adjacent to the mobile industry processor interface, of the corresponding data transmission line.

4. The data transmission circuit board according to claim 1, wherein a first terminal of the transient voltage suppression diode is connected to the corresponding data transmission line, and a second terminal of the transient voltage suppression diode is grounded.

5. The data transmission circuit board according to claim 4, wherein the transient voltage suppression diode is a unidirectional transient voltage suppression diode, a positive terminal of the unidirectional transient voltage suppression diode is connected to the data transmission line, and a negative terminal of the unidirectional transient voltage suppression diode is grounded.

6. The data transmission circuit board according to claim 4, wherein the transient voltage suppression diode is a bi-directional transient voltage suppression diode, a positive terminal of the bi-directional transient voltage suppression diode is connected to the data transmission line, and a negative terminal of the bi-directional transient voltage suppression diode is grounded.

7. The data transmission circuit board according to claim 4, wherein the transient voltage suppression diode is a bi-directional transient voltage suppression diode, a positive terminal of the bi-directional transient voltage suppression diode is grounded, and a negative terminal of the bi-directional transient voltage suppression diode is connected to the data transmission line.

8. The data transmission circuit board according to claim 1, wherein at least one data transmission line of each data transmission line pair is coupled to a differential impedance adjustment module; and
   the differential impedance adjustment module is configured to adjust a differential impedance of the coupled data transmission line.

9. The data transmission circuit board according to claim 8, wherein the differential impedance adjustment module comprises an adjustment resistor, and the adjustment resistor is connected in series with the data transmission line.

10. The data transmission circuit board according to claim 1, wherein a parasitic capacitance of the transient voltage suppression diode is less than 0.5 pf.

11. The data transmission circuit board according to claim 1, wherein the line width threshold range is from 20 μm to 50 μm.

12. The data transmission circuit board according to claim 1, wherein the data transmission circuit board is a flexible printed circuit.

13. A mobile industry processor interface, comprising the data transmission circuit board according to claim 1.

14. A display module, comprising the mobile industry processor interface according to claim 13.

15. An electronic device, comprising the mobile industry processor interface according to claim 13.

16. The electronic device according to claim 15, wherein the electronic device comprises a mobile terminal.

* * * * *